(12) United States Patent
Tang

(10) Patent No.: US 11,419,248 B2
(45) Date of Patent: Aug. 16, 2022

(54) DISPLAY MODULE AND DISPLAY DEVICE INCLUDING HEAT DISSIPATION LAYERS

(71) Applicant: WUHAN CHINA STAR OPTOELECTRONICS SEMICONDUCTOR DISPLAY TECHNOLOGY CO., LTD., Wuhan (CN)

(72) Inventor: Chihshun Tang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 275 days.

(21) Appl. No.: 16/620,289

(22) PCT Filed: Aug. 7, 2019

(86) PCT No.: PCT/CN2019/099565
§ 371 (c)(1),
(2) Date: Dec. 6, 2019

(87) PCT Pub. No.: WO2020/211221
PCT Pub. Date: Oct. 22, 2020

(65) Prior Publication Data
US 2021/0368658 A1 Nov. 25, 2021

(30) Foreign Application Priority Data
Apr. 19, 2019 (CN) .......................... 201910315731.8

(51) Int. Cl.
*H05K 7/20* (2006.01)

(52) U.S. Cl.
CPC ................................ *H05K 7/20963* (2013.01)

(58) Field of Classification Search
CPC ............ H05K 7/20954; H05K 7/20963; G09F 9/301; G02B 6/0085
See application file for complete search history.

(56) References Cited

U.S. PATENT DOCUMENTS 7,388,748 B2 * 6/2008 Shin ................... H05K 7/20963
361/704

* cited by examiner

*Primary Examiner* — Zachary Pape
(74) *Attorney, Agent, or Firm* — Osha Bergman Watanabe & Burton LLP

(57) ABSTRACT

The present invention provides a display module and a display device. By disposing a second heat dissipation layer between a first heat dissipation layer and a first substrate, and connecting the first heat dissipation layer with the second heat dissipation layer, heat in a driving chip is transmitted to the second heat dissipation layer and then directly transmitted to the first heat dissipation layer, thereby the display module allows the heat to be quickly distributed throughout the panel and reducing the temperature in the areas corresponding to the driving chip. Therefore, the present invention solves the technical problem that areas corresponding to driving chips have higher temperature when current display modules are in operation.

18 Claims, 5 Drawing Sheets

DISPLAY MODULE AND DISPLAY DEVICE INCLUDING HEAT DISSIPATION LAYERS

FIELD OF INVENTION

The present invention relates to the field of display technologies, and in particular, to a display module and a display device.

BACKGROUND OF INVENTION

Current display modules bend connecting areas of display panels backward to realize the extreme narrow bezel design of display panels. As shown in FIG. 1, when a current display module is in operation, heat of a driving chip needs to be transmitted to a heat conducting layer through a substrate, a first supporting film, and a reinforcing plate. As a result, heat conduction is slow so that an area corresponding to the driving chip has a higher temperature.

Therefore, when the current display module is in operation, there is a technical problem where areas corresponding to driving chips have higher temperatures.

Technical Problem

The present invention provides a display module and a display device for solving the technical problem that areas corresponding to driving chips have higher temperatures when current display modules are in operation.

Technical Solution

To solve the above problems, the technical solution provided by the present invention is as follows:

The present invention provides a display module comprising:

a substrate comprising a first substrate and a second substrate disposed opposite to each other, and a bent substrate connecting the first substrate and the second substrate;

a driving chip disposed on the first substrate and in a direction away from the second substrate, and the driving chip being bonded with the first substrate;

a first backplane disposed on the first substrate and being in a direction away from the driving chip;

a reinforcing layer disposed on the first backplane and being in a direction away from the first substrate;

a first heat dissipation layer disposed on the reinforcing layer and being in a direction away from the first backplane;

a second heat dissipation layer disposed between the first heat dissipation layer and the first substrate, and the first heat dissipation layer is connected to the second heat dissipation layer; and a second backplane disposed between the first heat dissipation layer and the second substrate.

In the display module of the present invention, the first heat dissipation layer is integrally disposed with the second heat dissipation layer, and the first heat dissipation layer is bent in a direction in which the second substrate is bent to form the second heat dissipation layer.

In the display module of the present invention, both ends of the second heat dissipation layer are connected to the first heat dissipation layer.

In the display module of the present invention, the second heat dissipation layer is bent toward the first heat dissipation layer to connect the first heat dissipation layer.

In the display module of the present invention, the second heat dissipation layer is disposed between the first backplane and the reinforcing layer, the reinforcing layer is provided with a via hole, and the first heat dissipation layer is connected to the second heat dissipation layer through the via hole.

In the display module of the present invention, the first heat dissipation layer extends into the via hole, and the first heat dissipation layer is connected to the second heat dissipation layer through the via hole.

In the display module of the present invention, the second heat dissipation layer extends into the via hole, and the second heat dissipation layer is connected to the first heat dissipation layer through the via hole.

In the display module of the present invention, further comprises a heat conductive element disposed in the via hole, and the first heat dissipation layer is connected to the second heat dissipation layer through the heat conductive element.

In the display module of the present invention, the heat conductive element comprises copper.

In the display module of the present invention, the second heat dissipation layer comprises heat conduction plates that are spaced apart, the reinforcing layer is provided with via holes in a region corresponding to the heat conduction plates, and the first heat dissipation layer and the heat conduction plates are connected through the via holes of the reinforcing layer.

In the display module of the present invention, further comprises a third heat dissipation layer, wherein the reinforcing layer comprises a first reinforcing layer and a second reinforcing layer, the first reinforcing layer and the second reinforcing layer are oriented along the first substrate toward the second substrate in sequence, the second heat dissipation layer is disposed between the first reinforcing layer and the first backplane, the third heat dissipation layer is disposed between the first reinforcing layer and the second reinforcing layer, the first heat dissipation layer is disposed between the second reinforcing layer and the second backplane, the first reinforcing layer is provided with a first via hole, the second heat dissipation layer is connected to the third heat dissipation layer through the first via hole, the second reinforcing layer is provided with a second via hole, and the first heat dissipation layer is connected to the third heat dissipation layer through the second via hole.

In the display module of the present invention, the third heat dissipation layer extends to the first via hole and the second via hole, the third heat dissipation layer is connected to the second heat dissipation layer through the first via hole, and the third heat dissipation layer is connected to the first heat dissipation layer through the second via hole.

In the display module of the present invention, the first heat dissipation layer is the same material as the second heat dissipation layer.

In the display module of the present invention, the material of the second heat dissipation layer comprises copper.

Meanwhile, the present invention provides a display device, which comprises a display module, and the display module comprising:

a substrate comprising a first substrate and a second substrate disposed opposite to each other, and a bent substrate connecting the first substrate and the second substrate;

a driving chip disposed on the first substrate and in a direction away from the second substrate, and the driving chip being bonded with the first substrate;

a first backplane disposed on the first substrate and being in a direction away from the driving chip;

a reinforcing layer disposed on the first backplane and being in a direction away from the first substrate;

a first heat dissipation layer disposed on the reinforcing layer and being in a direction away from the first backplane;

a second heat dissipation layer disposed between the first heat dissipation layer and the first substrate, and the first heat dissipation layer is connected to the second heat dissipation layer; and a second backplane disposed between the first heat dissipation layer and the second substrate.

In the display device of the present invention, the first heat dissipation layer is integrally disposed with the second heat dissipation layer, and the first heat dissipation layer is bent in a direction in which the second substrate is bent to form the second heat dissipation layer.

In the display device of the present invention, both ends of the second heat dissipation layer are connected to the first heat dissipation layer.

In the display device of the present invention, the second heat dissipation layer is bent toward the first heat dissipation layer to connect the first heat dissipation layer.

In the display device of the present invention, the second heat dissipation layer is disposed between the first backplane and the reinforcing layer, the reinforcing layer is provided with a via hole, and the first heat dissipation layer is connected to the second heat dissipation layer through the via hole.

In the display device of the present invention, the first heat dissipation layer extends into the via hole, and the first heat dissipation layer is connected to the second heat dissipation layer through the via hole.

Beneficial Effects

The present invention provides a display module and a display device. The display module comprises a substrate, a driving chip, a first backplane, a reinforcing layer, a first heat dissipation layer, a second heat dissipation layer, and a second backplane. The substrate comprises a first substrate and a second substrate disposed opposite to each other, and a bent substrate connecting the first substrate and the second substrate. The driving chip is disposed on the first substrate and in a direction away from the second substrate, and the driving chip is bonded with the first substrate. The first backplane is disposed on the first substrate and is in a direction away from the driving chip. The reinforcing layer is disposed on the first backplane and is in a direction away from the first substrate. The first heat dissipation layer is disposed on the reinforcing layer and is in a direction away from the first backplane. The second heat dissipation layer is disposed between the first heat dissipation layer and the first substrate, and the first heat dissipation layer is connected to the second heat dissipation layer. The second backplane is disposed between the first heat dissipation layer and the second substrate. By disposing the second heat dissipation layer between the first heat dissipation layer and the first substrate, and connecting the first heat dissipation layer with the second heat dissipation layer, heat in the driving chip is transmitted to the second heat dissipation layer and then directly transmitted to the first heat dissipation layer, thereby allowing the heat to be quickly distributed throughout the panel and reducing the temperature in the areas corresponding to the driving chip. Therefore, the present invention solves the technical problem that areas corresponding to driving chips have higher temperature when current display modules are in operation.

DESCRIPTION OF DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF PREFERRED EMBODIMENTS

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

The present invention addresses a technical problem where areas corresponding to driving chips have higher temperatures when current display modules are in operation. Embodiments of the present invention are used to solve the problem.

Figure 1:
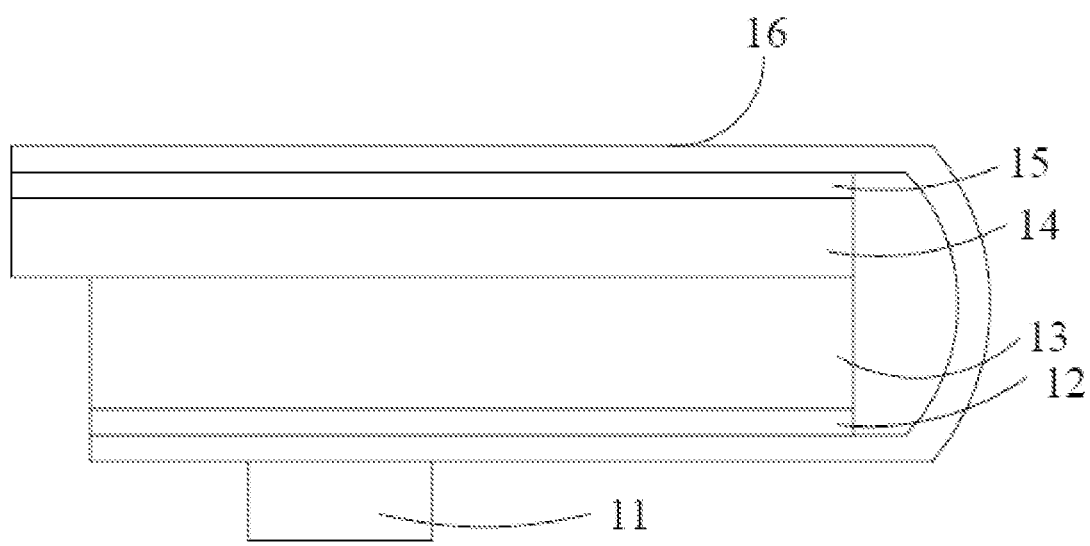
FIG. 1 is a schematic diagram of a current display module.

As shown in FIG. 1, a current display module comprises a driving chip 11, a first supporting film 12, a reinforcing plate 13, a heat conducting layer 14, a second supporting film 15, and a substrate 16. When the current display module is in operation, heat on the driving chip 11 needs to be transmitted to the heat conducting layer 14 through the substrate 16, the first supporting film 12, and the reinforcing plate 13, which leads to slow heat conduction. As a result, heat of an area corresponding to a driving chip is difficult to be transmitted to an entire panel, and the area corresponding to the driving chip has a higher temperature. Therefore, when the current display module is in operation, there is a technical problem that the area corresponding to the driving chips has a higher temperature.

Figure 2:
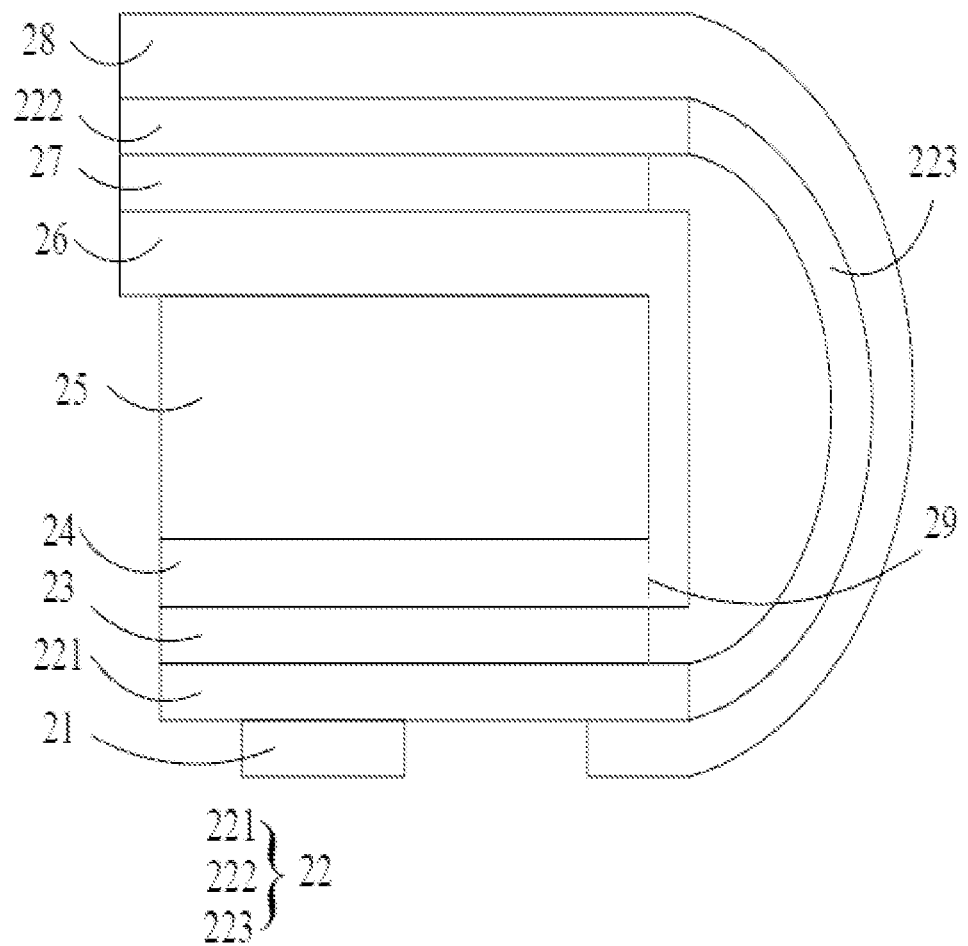
FIG. 2 is a first schematic diagram of a display module according to an embodiment of the present invention.

As shown in FIG. 2, the present invention provides a display module. The display module comprises:

a substrate 22 comprising a first substrate 221 and a second substrate 222 disposed opposite each other, and a bent substrate 223 connecting the first substrate 221 and the second substrate 222;

a driving chip 21 disposed on the first substrate 221 and in a direction away from the second substrate 222, and the driving chip 21 is bonded to the first substrate 221;

a first backplane 23 disposed on the first substrate 221 and in a direction away from the driving chip 21;

a reinforcing layer 25 disposed on the first backplane 23 and in a direction away from the first substrate 221;

a first heat dissipation layer 26 disposed on the reinforcing layer 25 and in a direction away from the first backplane 23;

a second heat dissipation layer 24 disposed between the first heat dissipation layer 26 and the first substrate 221, and the first heat dissipation layer 26 is connected to the second heat dissipation layer 24; and a second backplane 27 disposed between the first heat dissipation layer 26 and the second substrate 222.

An embodiment of the present invention provides a display module. The display module comprises a substrate, a driving chip, a first backplane, a reinforcing layer, a first heat dissipation layer, a second heat dissipation layer, and a second backplane. The substrate comprises a first substrate and a second substrate disposed opposite each other, and a bent substrate connecting the first substrate and the second substrate. The driving chip is disposed on the first substrate and in a direction away from the second substrate, and the driving chip is bonded to the first substrate. The first backplane is disposed on the first substrate and in a direction away from the driving chip. The reinforcing layer is disposed on the first backplane and in a direction away from the first substrate. The first heat dissipation layer is disposed on the reinforcing layer and in a direction away from the first backplane. The second heat dissipation layer is disposed between the first heat dissipation layer and the first substrate, and the first heat dissipation layer is connected to the second heat dissipation layer. The second backplane is disposed between the first heat dissipation layer and the second substrate. By disposing the second heat dissipation layer between the first heat dissipation layer and the first substrate, and connecting the first heat dissipation layer to the second heat dissipation layer, heat in the driving chip is transmitted to the second heat dissipation layer, and then directly transmitted to the first heat dissipation layer, thereby allowing the heat to be quickly distributed throughout the panel and reducing the temperature in the areas corresponding to the driving chip. Therefore, the present invention solves the technical problem where areas corresponding to driving chips have higher temperatures when current display modules are in operation.

In an embodiment, as shown in FIG. 2, the embodiment of the present invention provides a display module. The display module comprises a panel 28. The first heat dissipation layer 26 is integrally disposed with the second heat dissipation layer 24, and the first heat dissipation layer 26 is bent in a direction in which the second substrate 222 is bent to form the second heat dissipation layer 24. By bending the first heat dissipation layer 26 to form the second heat dissipation layer 24, heat in the driving chip is transmitted to the second heat dissipation layer through the first substrate and the first backplane, then the second heat dissipation layer directly transmits the heat to the first heat dissipation layer, and the second heat dissipation layer can transmit the heat to the first heat dissipation layer through the reinforcing layer at the same time. This allows the heat of the driving chip to be quickly transferred to the first heat dissipation layer, thereby allowing the heat to be quickly distributed throughout the panel and reducing the temperature in the areas corresponding to the driving chip. Therefore, it solves the technical problem where the areas corresponding to the driving chips have higher temperatures when the current display modules are in operation.

In an embodiment, the first heat dissipation layer is bent to extend to an area corresponding to the driving chip to form the second heat dissipation layer, or the first heat dissipation layer is bent such that the second heat dissipation layer corresponds to an area of the reinforcing layer.

It should be noted that a dotted line 29 in the drawings is for distinguishing between the first heat dissipation layer and the second heat dissipation layer, which is convenient for description. In practice, the dotted line does not exist.

It should be noted that the sizes of the second substrate, the second backplane, the panel, and the first heat dissipation layer are much larger than the sizes of the first substrate, the first backplane, the second heat dissipation layer, and the reinforcing layer.

In an embodiment, the first heat dissipation layer is integrally disposed with the second heat dissipation layer, and both ends of the second heat dissipation layer are connected to the first heat dissipation layer. By connecting both ends of the second heat dissipation layer to the first heat dissipation layer, after the heat in the driving chip is transmitted to the second heat dissipation layer, the second heat dissipation layer can transmit the heat from the both ends to the first heat dissipation layer, and the second heat dissipation layer can transmit the heat to the first heat dissipation layer through the reinforcing layer at the same time. It speeds up the heat conduction, thereby speeding up the heat dissipation of the driving chip, reducing the temperature of the area corresponding to the driving chip, and solving the technical problem where the areas corresponding to the driving chips have higher temperatures when the current display modules are in operation.

In an embodiment, the second heat dissipation layer is bent toward the first heat dissipation layer to connect to the first heat dissipation layer. The second heat dissipation layer is disposed between the first heat dissipation layer and the first substrate, and then the second heat dissipation layer extends toward the first heat dissipation layer, so that the first heat dissipation layer is connected to the second heat dissipation layer, and the second heat dissipation layer directly transmits the heat to the first heat dissipation layer.

In an embodiment, both ends of the second heat dissipation layer are bent toward the first heat dissipation layer. As a result, when the heat is transmitted to the second heat dissipation layer, the heat can be transmitted to the first heat dissipation layer through both ends of the second heat dissipation layer, which speeds up the heat conduction and reduces the temperature of the area corresponding to the driving chip.

In an embodiment, the first heat dissipation layer is made of the same material as the second heat dissipation layer, or the first heat dissipation layer and the second heat dissipation layer are made of different materials.

In an embodiment, the material of the second heat dissipation layer includes at least one of copper, silver, and iron.

In an embodiment, a buffer layer is disposed between the first heat dissipation layer and the first backplane.

Figure 3:
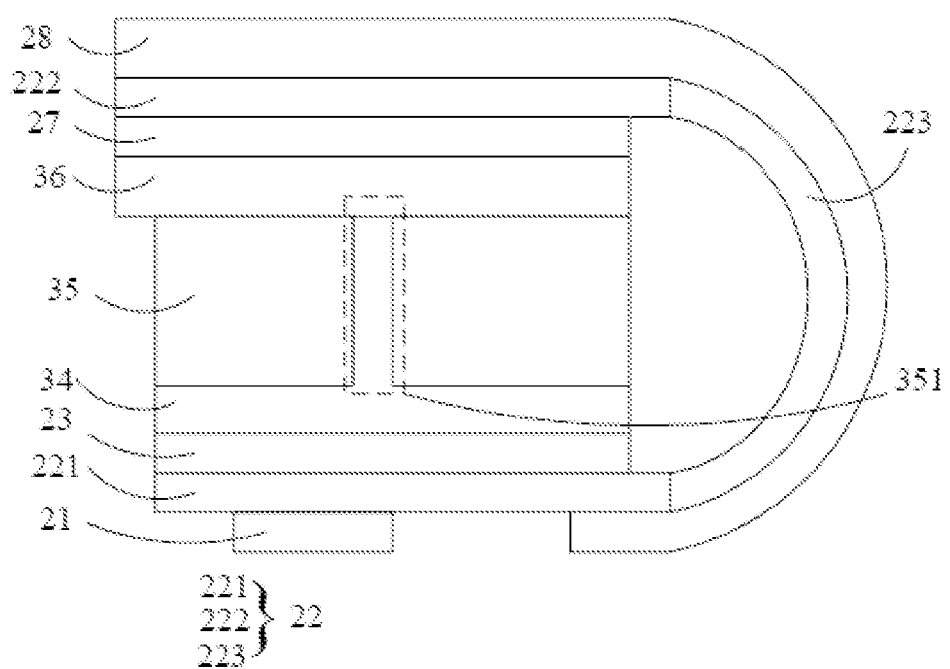
FIG. 3 is a second schematic diagram of a display module according to an embodiment of the present invention.

In an embodiment, as shown in FIG. 3, the second heat dissipation layer 34 is disposed between the first backplane 23 and the reinforcing layer 35, the reinforcing layer 35 is provided with a via hole 351, and the first heat dissipation layer 36 is connected to the second heat dissipation layer 34 through the via hole 351. By disposing the second heat dissipation layer between the first backplane and the reinforcing layer and arranging the via hole in the reinforcing layer, the first heat dissipation layer can be connected to the second heat dissipation layer through the via hole 351, thereby directly transmitting the heat in the driving chip from the second heat dissipation layer to the first heat dissipation layer, and reducing the temperature of the area corresponding to the driving chip.

In an embodiment, as shown in FIG. 3, the second heat dissipation layer extends into the via hole, and the second heat dissipation layer is connected to the first heat dissipation layer through the via hole. By extending the second heat dissipation layer into the via hole, the second heat dissipation layer can be connected to the first heat dissipation layer, thereby directly transmitting the heat from the second heat dissipation layer to the first heat dissipation layer.

It should be noted that, in FIG. 3, the second heat dissipation layer extends into the via hole. In the drawings, the second heat dissipation layer covers the via hole. The area and the size of the via hole are shown by a dotted line, that is, the via hole 351 is shown in FIG. 3.

In an embodiment, the first heat dissipation layer extends into the via hole, and the first heat dissipation layer is connected to the second heat dissipation layer through the via hole.

In an embodiment, the first heat dissipation layer and the second heat dissipation layer extend into the via hole, and the first heat dissipation layer is connected to the second heat dissipation layer in the via hole.

In an embodiment, a heat conductive element is disposed in the via hole, and the first heat dissipation layer is connected to the second heat dissipation layer through the heat conductive element. By disposing the heat conductive element in the via hole, the heat is directly transmitted to the first heat dissipation layer after the heat is transmitted from the second heat dissipation layer to the heat conductive element, thereby directly transmitting the heat from the second heat dissipation layer to the first heat dissipation layer and reducing the temperature of the area corresponding to the driving chip.

In an embodiment, the material of the heat conductive element includes at least one of copper, silver, and iron.

Figure 4:
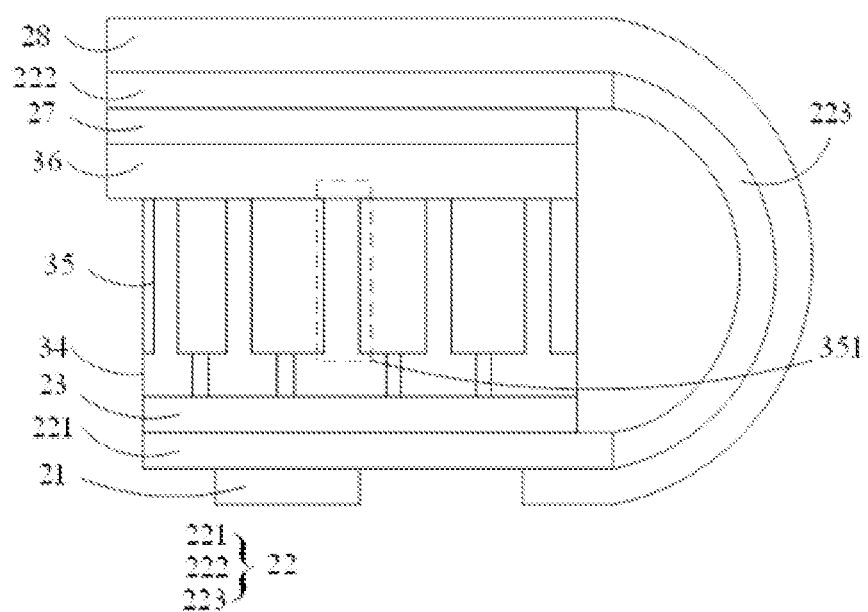
FIG. 4 is a third schematic diagram of a display module according to an embodiment of the present invention.

In an embodiment, as shown in FIG. 4, the second heat dissipation layer comprises heat conduction plates that are spaced apart, the reinforcing layer is provided with via holes in a region corresponding to the heat conduction plates, and the first heat dissipation layer and the heat conduction plates are connected through the via holes of the reinforcing layer. By making the second heat dissipation layer comprising the plurality of heat conduction plates spaced apart and connecting the heat conduction plates to the first heat dissipation layer, the heat transmitted to the heat conduction plates can be directly transmitted to the first heat dissipation layer through the via holes, and thus reducing the temperature of the area corresponding to the driving chip.

In an embodiment, the spaced apart heat conduction plates are connected, or the spaced apart heat conduction plates are not connected. By transmitting the heat to the first heat dissipation layer through the plurality of heat conduction plates, it allows the heat to be quickly distributed throughout the panel and reducing the temperature in the areas corresponding to the driving chip.

In an embodiment, the first heat dissipation layer extends toward the via hole and is connected to the heat conduction plate through the via hole, or the heat conduction plates extend into the via hole, and connect to the first heat dissipation layer through the via hole, or the first heat dissipation layer and the heat conduction plate extend into the via hole to connect the first heat dissipation layer to the heat conduction plate.

Figure 5:
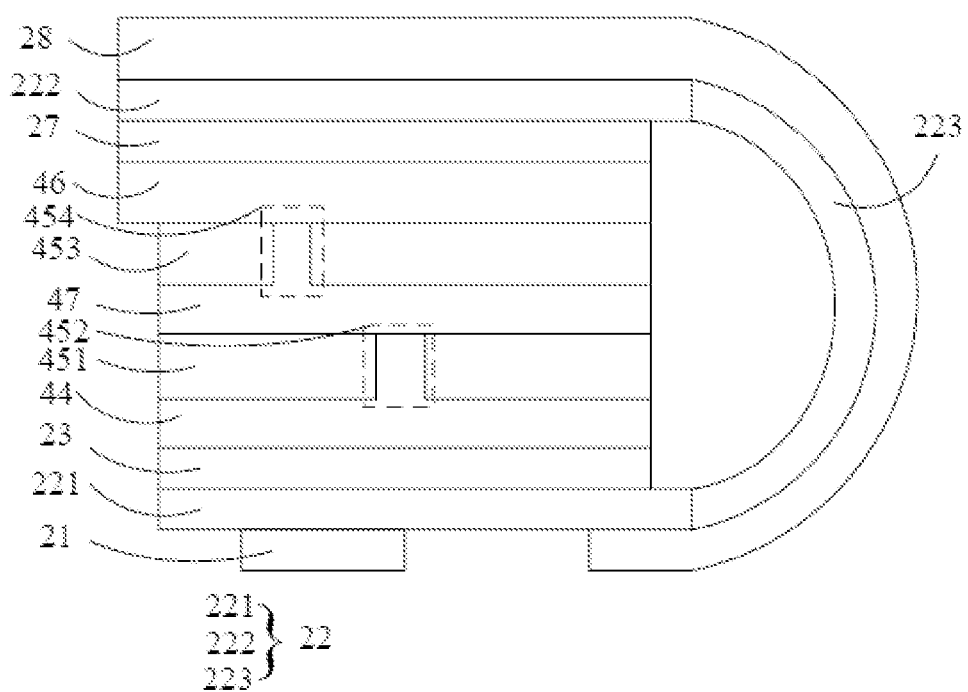
FIG. 5 is a fourth schematic diagram of a display module according to an embodiment of the present invention.

As shown in FIG. 5, an embodiment of the present invention provides a display module. The display module comprises a first heat dissipation layer 46, a second heat dissipation layer 44, a third heat dissipation layer 47, and a reinforcing layer. The reinforcing layer comprises a first reinforcing layer 451 and a second reinforcing layer 453. The first reinforcing layer 451 and the second reinforcing layer 453 are disposed along the first substrate 221 toward the second substrate 222 in sequence. The second heat dissipation layer 44 is disposed between the first reinforcing layer 451 and the first backplane 23. The third heat dissipation layer 47 is disposed between the first reinforcing layer 451 and the second reinforcing layer 453. The first heat dissipation layer 46 is disposed between the second reinforcing layer 453 and the second backplane 27. The first reinforcing layer 451 is provided with a first via hole 452. The second heat dissipation layer 44 is connected to the third heat dissipation layer 47 through the first via hole 452. The second reinforcing layer 453 is provided with a second via hole 454, and the first heat dissipation layer 46 is connected to the third heat dissipation layer 47 through the second via hole 454. By disposing the third heat dissipation layer between the first reinforcing layer and the second reinforcing layer, and disposing the second heat dissipation layer between the first reinforcing layer and the first backplane, the heat in the driving chip is transmitted to the second heat dissipation layer, then the second heal dissipation layer directly transmits the heat to the third heat dissipation layer, and then the third heat dissipation layer directly transmits the heat to the first heat dissipation layer, which allows the heat to be quickly distributed throughout the panel and reduces the temperature in the areas corresponding to the driving chip.

In the display module of the present invention, the third heat dissipation layer extends to the first via hole and the second via hole. The third heat dissipation layer is connected to the second heat dissipation layer through the first via hole, and the third heat dissipation layer is connected to the first heat dissipation layer through the second via hole.

In an embodiment, the projection of the first via hole and the projection of the second via hole coincide on the first substrate, and the second heat dissipation layer directly transmits the heat to the third heat dissipation layer after the heat is transmitted to the second heat dissipation layer. At the same time, the second heat dissipation layer transmits the heat to the third heat dissipation layer through the first reinforcing layer, and then the third heat dissipation layer directly transfers the heat to the first heat dissipation layer. At the same time, the third heat dissipation layer transmits the heat to the first heat dissipation layer through the second reinforcing layer, which accelerates the heat conduction of the driving chip and reduces the temperature in the areas corresponding to the driving chip.

In an embodiment, the second via hole is disposed away from the bent substrate. By disposing the second via hole away from the bent substrate, the third heat dissipation layer transmits the heat to the first heat dissipation layer after the heat is transmitted to the third heat dissipation layer. The first heat dissipation layer allows the heat to be quickly distributed throughout the panel and reduces the temperature in the areas corresponding to the driving chip.

In an embodiment, a plurality of via holes are disposed on the first reinforcing layer and the second reinforcing layer, which allow the heat to be quickly transmitted form the second heat dissipation layer to the first heat dissipation layer, and reduce the temperature in the areas corresponding to the driving chip.

In an embodiment, the second heat dissipation layer is disposed between the first backplane and the first substrate. The first backplane is provided with a third via hole, and the reinforcement layer is provided with a fourth a via hole. The second heat dissipation layer and the first heat dissipation layer are connected through the third via hole and the fourth via hole.

In an embodiment, the second heat dissipation layer is disposed in an area corresponding to the driving chip. By disposing the second heat dissipation layer in the area corresponding to the driving chip, the second heat dissipation layer directly transmits the heat to the first heat dissipation layer after the heat is transmitted to the second heat dissipation layer, which allows the heat to be quickly distributed throughout the panel and reduces the temperature in the areas corresponding to the driving chip.

In an embodiment, the first substrate is provided with a fifth via hole, and the first back plate is provided with a sixth via hole. The second heat dissipation layer extends to the fifth via hole to be connected to the driving chip, and the second heat dissipation layer is connected to the first heat dissipation layer. By respectively connecting the first heat dissipation layer and the driving chip to the second heat dissipation layer, heat in a first driving chip is directly transmitted to the second heat dissipation layer, and then the second heat dissipation layer directly transmits the heat to the first heat dissipation layer, thereby speeding up the heat conduction and reducing the temperature in the areas corresponding to the driving chip.

In an embodiment, the display module comprises a liquid crystal display module, and the panel comprises an array layer, a liquid crystal, and a color filter substrate. By bending the array layer, a connecting area can be disposed in the direction away from the light emitting direction of the display module, thereby achieving a very narrow bezel.

An embodiment of the present invention provides a display device, which comprises a display module. The display module comprises:

a substrate comprising a first substrate and a second substrate disposed opposite each other, and a bent substrate connecting the first substrate and the second substrate;

a driving chip disposed on the first substrate and in a direction away from the second substrate, and the driving chip is bonded to the first substrate;

a first backplane disposed on the first substrate and in a direction away from the driving chip;

a reinforcing layer disposed on the first backplane and in a direction away from the first substrate;

a first heat dissipation layer disposed on the reinforcing layer and in a direction away from the first backplane;

a second heat dissipation layer disposed between the first heat dissipation layer and the first substrate, and the first heat dissipation layer is connected to the second heat dissipation layer; and a second backplane disposed between the first heat dissipation layer and the second substrate.

An embodiment of the present invention provides a display device, which comprises a display module. The display module comprises a substrate, a driving chip, a first backplane, a reinforcing layer, a first heat dissipation layer, a second heat dissipation layer, and a second backplane. The substrate comprises a first substrate and a second substrate disposed opposite each other, and a bent substrate connecting the first substrate and the second substrate. The driving chip is disposed on the first substrate and in a direction away from the second substrate, and the driving chip is bonded to the first substrate. The first backplane is disposed on the first substrate and in a direction away from the driving chip. The reinforcing layer is disposed on the first backplane and in a direction away from the first substrate. The first heat dissipation layer is disposed on the reinforcing layer and in a direction away from the first backplane. The second heat dissipation layer is disposed between the first heat dissipation layer and the first substrate, and the first heat dissipation layer is connected to the second heat dissipation layer. The second backplane is disposed between the first heat dissipation layer and the second substrate. By disposing the second heat dissipation layer between the first heat dissipation layer and the first substrate, and connecting the first heat dissipation layer to the second heat dissipation layer, heat in the driving chip is transmitted to the second heat dissipation layer, and then directly transmitted to the first heat dissipation layer, thereby allowing the heat to be quickly distributed throughout the panel and reducing the temperature in the areas corresponding to the driving chip. Therefore, the present invention solves the technical problem where areas corresponding to driving chips have higher temperatures when current display modules are in operation.

In an embodiment, the first heat dissipation layer is integrally disposed with the second heat dissipation layer, and the first heat dissipation layer is bent in a direction in which the first substrate is bent to form the second heat dissipation layer.

In an embodiment, both ends of the second heat dissipation layer are connected to the first heat dissipation layer.

In an embodiment, the second heat dissipation layer is bent toward the first heat dissipation layer to connect to the first heat dissipation layer.

In an embodiment, the second heat dissipation layer is disposed between the first backplane and the reinforcing layer, the reinforcing layer is provided with a via hole, and the first heat dissipation layer is connected to the second heat dissipation layer through the via hole.

In an embodiment, the second heat dissipation layer extends into the via hole, and the second heat dissipation layer is connected to the first heat dissipation layer through the via hole.

In an embodiment, the first heat dissipation layer extends into the via hole, and the first heat dissipation layer is connected to the second heat dissipation layer through the via hole.

In an embodiment, the display device further comprises a touch module, and the touch module is connected to the display module through an optical glue.

According to the above embodiment, it can be known that:

An embodiment of the present invention provides a display module. The display module comprises a substrate, a driving chip, a first backplane, a reinforcing layer, a first heat dissipation layer, a second heat dissipation layer, and a second backplane. The substrate comprises a first substrate and a second substrate disposed opposite each other, and a bent substrate connecting the first substrate and the second substrate. The driving chip is disposed on the first substrate and in a direction away from the second substrate, and the driving chip is bonded to the first substrate. The first backplane is disposed on the first substrate and in a direction away from the driving chip. The reinforcing layer is disposed on the first backplane and in a direction away from the first substrate. The first heat dissipation layer is disposed on the reinforcing layer and in a direction away from the first backplane. The second heat dissipation layer is disposed between the first heat dissipation layer and the first substrate, and the first heat dissipation layer is connected to the second heat dissipation layer. The second backplane is disposed between the first heat dissipation layer and the second substrate. By disposing the second heat dissipation layer between the first heat dissipation layer and the first substrate, and connecting the first heat dissipation layer to the second heat dissipation layer, heat in the driving chip is transmitted to the second heat dissipation layer, and then directly transmitted to the first heat dissipation layer, thereby allowing the heat to be quickly distributed throughout the panel and reducing the temperature in the areas corresponding to the driving chip. Therefore, the present invention solves the technical problem where areas corresponding to driving chips have higher temperatures when current display modules are in operation.

In summary, although the present invention has been disclosed above in the preferred embodiments, the above preferred embodiments are not intended to limit the present invention. A person skilled in the art can make various modifications and refinements without departing from the spirit and scope of the present invention, and the scope of the present application is defined by the scope defined by the claims.

What is claimed is:

1. A display module, comprising:
   a substrate comprising a first substrate and a second substrate disposed opposite each other, and a bent substrate connecting the first substrate and the second substrate;
   a driving chip disposed on the first substrate and in a direction away from the second substrate, the driving chip being bonded to the first substrate;
   a first backplane disposed on the first substrate and in a direction away from the driving chip;
   a reinforcing layer disposed on the first backplane and in a direction away from the first substrate;
   a first heat dissipation layer disposed on the reinforcing layer and in a direction away from the first backplane;
   a second heat dissipation layer disposed between the first heat dissipation layer and the first substrate, and the first heat dissipation layer is connected to the second heat dissipation layer; and
   a second backplane disposed between the first heat dissipation layer and the second substrate,
   wherein the second heat dissipation layer is disposed between the first backplane and the reinforcing layer,
   wherein one of the first heat dissipation layer and the second heat dissipation layer is bent toward and connected to another of the first heat dissipation layer and the second heat dissipation layer.

2. The display module as claimed in claim 1, wherein the first heat dissipation layer is integrally disposed with the second heat dissipation layer, and the first heat dissipation layer is bent in a direction in which the second substrate is bent to form the second heat dissipation layer.

3. The display module as claimed in claim 2, wherein both ends of the second heat dissipation layer are connected to the first heat dissipation layer.

4. The display module as claimed in claim 1, wherein the second heat dissipation layer is bent toward the first heat dissipation layer to connect to the first heat dissipation layer.

5. A display module, comprising,
   a substrate comprising a first substrate and a second substrate disposed opposite each other, and a bent substrate connecting the first substrate and the second substrate;
   a driving chip disposed on the first substrate and in a direction away from the second substrate, the driving chip being bonded to the first substrate;
   a first backplane disposed on the first substrate and in a direction away from the driving chip;
   a first reinforcing layer disposed on the first backplane and in a direction away from the first sub state;
   a first heat dissipation layer disposed on the first reinforcing layer and in a direction away from the first backplane;
   a second heat dissipation layer disposed between the first heat dissipation layer and the first substrate, and the first heat dissipation layer is connected to the second heat dissipation layer; and
   a second backplane disposed between the first heat dissipation layer and the second substrate,
   wherein the second heat dissipation layer is disposed between the first backplane and the first reinforcing layer, the first reinforcing layer is provided with a first via hole, and the first heat dissipation layer is connected to the second heat dissipation layer through the first via hole.

6. The display module as claimed in claim 5, wherein the first heat dissipation layer extends into the first via hole, and the first heat dissipation layer is connected to the second heat dissipation layer through the first via hole.

7. The display module as claimed in claim 5, wherein the second heat dissipation layer extends into the first via hole, and the second heat dissipation layer is connected to the first heat dissipation layer through the first via hole.

8. The display module as claimed in claim 5, further comprising a heat conductive element disposed in the first via hole, and the first heat dissipation layer is connected to the second heat dissipation layer through the heat conductive element.

9. The display module as claimed in claim 8, wherein the heat conductive element comprises copper.

10. The display module as claimed in claim 5, wherein the second heat dissipation layer comprises heat conduction plates that are spaced apart, the first reinforcing layer is provided with first via holes in a region corresponding to the heat conduction plates, and the first heat dissipation layer and the heat conduction plates are connected through the first via holes of the first reinforcing layer.

11. The display module as claimed in claim 5, further comprising a third heat dissipation layer and a second reinforcing layer, the second reinforcing layer and the first reinforcing layer are disposed along the first substrate toward the second substrate in sequence, the second heat dissipation layer is disposed between the first reinforcing layer and the second reinforcing layer, the third heat dissipation layer is disposed between the second reinforcing layer and the first backplane, the first heat dissipation layer is disposed between the first reinforcing layer and the second backplane, the second reinforcing layer is provided with a second via hole, the second heat dissipation layer is connected to the third heat dissipation layer through the second via hole.

12. The display module as claimed in claim 11, wherein the second heat dissipation layer extends to the first via hole and the second via hole, the second heat dissipation layer is connected to the third heat dissipation layer through the second via hole, and the second heat dissipation layer is connected to the first heat dissipation layer through the first via hole.

13. The display module as claimed in claim 1, wherein the first heat dissipation layer is made of the same material as the second heat dissipation layer.

14. The display module as claimed in claim 13, wherein the material of the second heat dissipation layer comprises copper.

15. A display device, which comprises a display module, and the display module comprises:
   a substrate comprising a first substrate and a second substrate disposed opposite each other, and a bent substrate connecting the first substrate and the second substrate;

a driving chip disposed on the first substrate and in a direction away from the second substrate, wherein the driving chip is bonded to the first substrate;
a first backplane disposed on the first substrate and in a direction away from the driving chip;
a reinforcing layer disposed on the first backplane and in a direction away from the first substrate;
a first heat dissipation layer disposed on the reinforcing layer and in a direction away from the first backplane;
a second heat dissipation layer disposed between the first heat dissipation layer and the first substrate, and the first heat dissipation layer is connected to the second heat dissipation layer; and
a second backplane disposed between the first heat dissipation layer and the second substrate,
wherein the second heat dissipation layer is disposed between the first backplane and the reinforcing layer,
wherein one of the first heat dissipation layer and the second heat dissipation layer is bent toward and connected to another of the first heat dissipation layer and the second heat dissipation layer.

16. The display device as claimed in claim 15, wherein the first heat dissipation layer is integrally disposed with the second heat dissipation layer, and the first heat dissipation layer is bent in a direction in which the second substrate is bent to form the second heat dissipation layer.

17. The display device as claimed in claim 16, wherein both ends of the second heat dissipation layer are connected to the first heat dissipation layer.

18. The display device as claimed in claim 15, wherein the second heat dissipation layer is bent toward the first heat dissipation layer to connect to the first heat dissipation layer.

* * * * *